United States Patent
Yang

(10) Patent No.: US 8,938,983 B2
(45) Date of Patent: Jan. 27, 2015

(54) DATA CENTER CONTAINER WITH COOLING SYSTEM

(71) Applicant: Xu Yang, Shenzhen (CN)

(72) Inventor: Xu Yang, Shenzhen (CN)

(73) Assignees: Hon Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 240 days.

(21) Appl. No.: 13/681,223

(22) Filed: Nov. 19, 2012

(65) Prior Publication Data

US 2013/0213604 A1  Aug. 22, 2013

(30) Foreign Application Priority Data

Feb. 22, 2012  (CN) .......................... 2012 1 0040230

(51) Int. Cl.
| F25D 23/12 | (2006.01) |
| H05K 7/20 | (2006.01) |
| F25D 21/14 | (2006.01) |
| H05K 7/14 | (2006.01) |

(52) U.S. Cl.
CPC .......... *H05K 7/20763* (2013.01); *F25D 21/14* (2013.01); *H05K 7/1497* (2013.01); *H05K 7/2079* (2013.01)
USPC .......................................... 62/259.2; 62/291

(58) Field of Classification Search
CPC .......... H05K 7/20763; H05K 7/72079; H05K 7/1497; F25D 21/14
USPC ................ 62/291, 272, 288, 259.2; 165/80.4, 165/104.33; 361/687, 696, 701
See application file for complete search history.

(56) References Cited

U.S. PATENT DOCUMENTS

| 5,345,779 | A * | 9/1994 | Feeney .......................... 62/259.2 |
| 7,011,143 | B2 * | 3/2006 | Corrado et al. .............. 165/80.4 |
| 7,104,081 | B2 * | 9/2006 | Chu et al. ...................... 62/259.2 |
| 7,990,710 | B2 * | 8/2011 | Hellriegel et al. ............ 361/699 |
| 8,553,416 | B1 * | 10/2013 | Carlson et al. ................ 361/701 |
| 2005/0217299 | A1 * | 10/2005 | Chu et al. ...................... 62/259.2 |
| 2007/0281639 | A1 * | 12/2007 | Clidaras et al. ............... 455/128 |
| 2008/0060372 | A1 * | 3/2008 | Hillis et al. .................... 62/259.2 |
| 2009/0168345 | A1 * | 7/2009 | Martini ......................... 361/691 |
| 2009/0259343 | A1 * | 10/2009 | Rasmussen et al. .......... 700/282 |
| 2011/0313576 | A1 * | 12/2011 | Nicewonger .................. 700/282 |
| 2012/0071082 | A1 * | 3/2012 | Karamanos .................... 454/284 |
| 2012/0140415 | A1 * | 6/2012 | Driggers ....................... 361/692 |

* cited by examiner

*Primary Examiner* — Mohammad M Ali
(74) *Attorney, Agent, or Firm* — Novak Druce Connolly Bove + Quigg LLP

(57) ABSTRACT

A data center container includes a chassis, a cover, a cooling system, a water outlet, a water tray, and a connecting pipe. The cover is secured to the chassis. The cooling system is located in the chassis and includes a water inflow portion, a water outflow portion, and a drainer tray. The water outlet is located in the chassis. The water outlet communicates with the drainer tray and extends out of the chassis. The drainer tray is secured to the chassis. The water inflow portion and the water outflow portion are located between the cover and the water tray. The connecting pipe connects the water tray with the drainer tray. The water tray receives condensation dripping from the water inflow portion and the water outflow portion.

20 Claims, 6 Drawing Sheets

DATA CENTER CONTAINER WITH COOLING SYSTEM

BACKGROUND

1. Technical Field

The present disclosure relates to data center containers, and particularly to a data center container with a cooling system.

2. Description of Related Art

A cooling system can be mounted in a data center container for cooling the data center container. Generally, the cooling system includes a water inlet, a heat exchanger, and a water outlet. Cold water flows into the heat exchanger via the water inlet and heated water flows out of the data center container through the water outlet. In this process, condensation may form on outer surfaces of the water inlet and the water outlet and drip down, which may affect the appearance under the water inlet and the water outlet.

Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
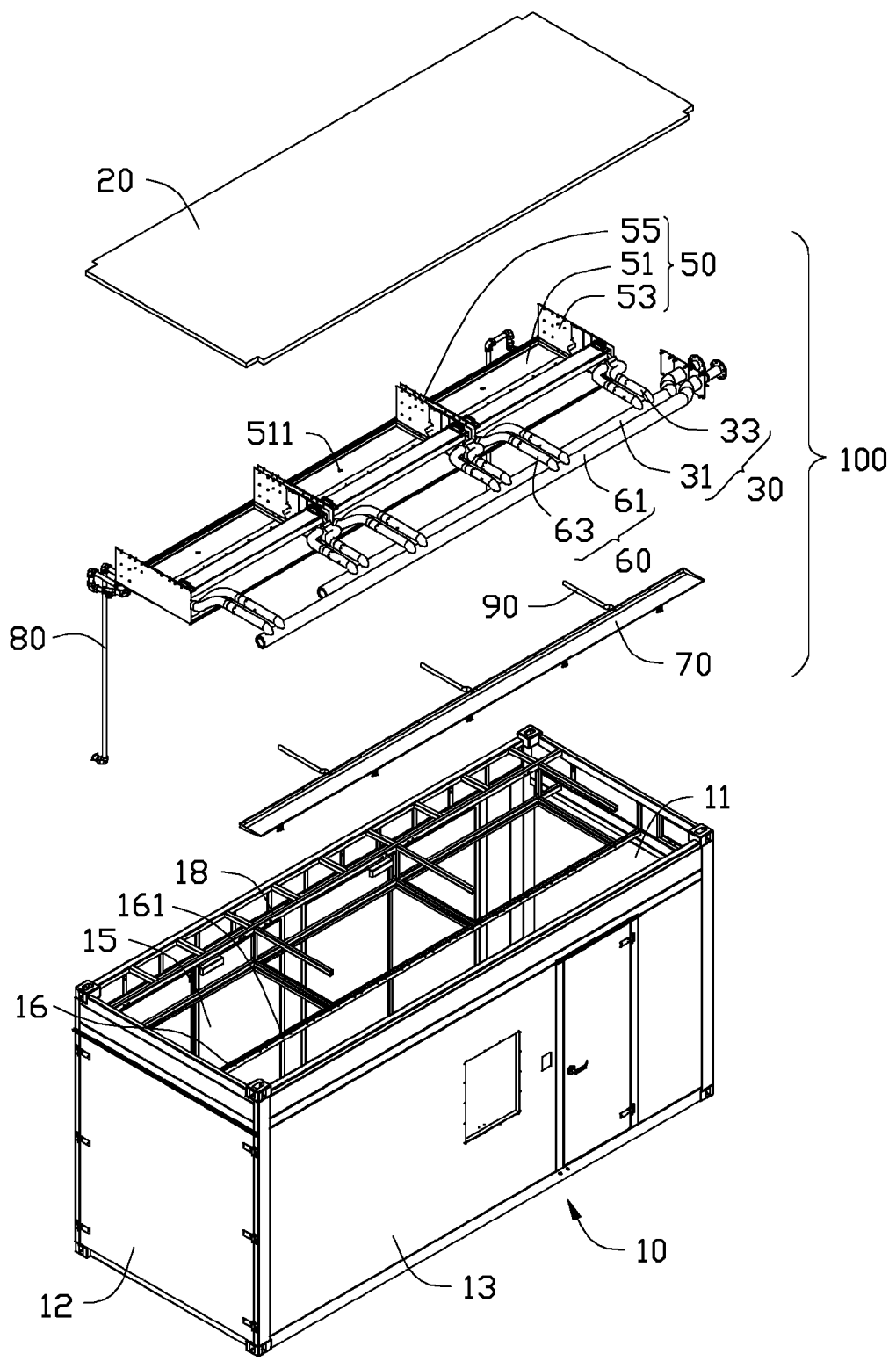
FIG. 1 is an exploded, isometric view of an embodiment of a data center container.
Figure 2:
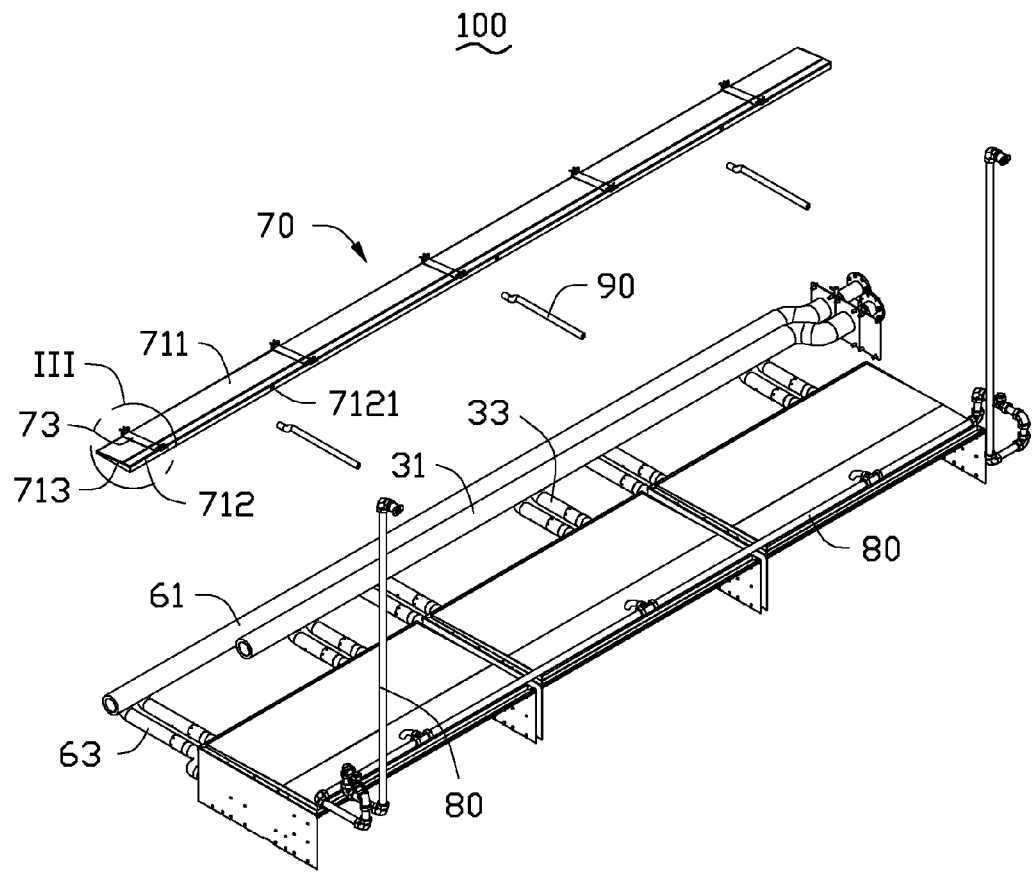
FIG. 2 is an exploded, isometric view of a cooling system of the data center container of FIG. 1.
Figure 3:
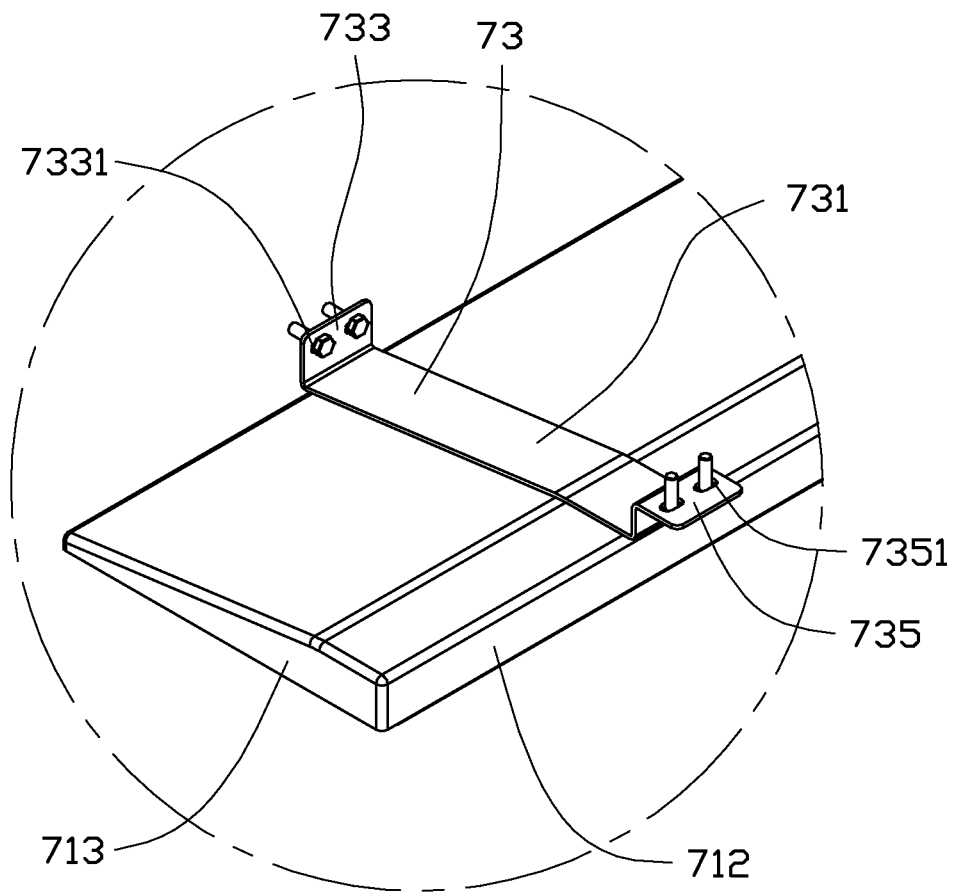
FIG. 3 is an enlarged view of a circled portion III of the data center container of FIG. 1.

Referring to FIGS. 1-3, a data center container in accordance with an embodiment is shown. The data center container comprises a chassis 10, a cover 20, and a cooling system 100.

The chassis 10 comprises a front plate 11, a rear plate 12, a first side plate 13, and a second side plate 15. In one embodiment, the front plate 11 is substantially parallel to the rear plate 12, the first side plate 13 is substantially parallel to the second side plate 15, and the first side plate 13 is substantially perpendicular to the front plate 11. A support pole 16 with a plurality of mounting poles 18 is secured between the front plate 11 and the rear plate 12. The support pole 16 defines a plurality of installation holes 161.

The cover 20 can be secured to the chassis 10.

The cooling system 100 comprises a water inflow portion 30, a plurality of drainer trays 50, a water outflow portion 60, a water tray 70, a plurality of water outlets 80, and a plurality of connecting pipes 90.

The water inflow portion 30 comprises a first water inlet 31 and a plurality of second water inlets 33, connected to the first water inlet 31. The first water inlet 31 is connected to a water source (not shown). In one embodiment, the first water inlet 31 is substantially perpendicular to each of the second water inlets 33.

Each drainer tray 50 comprises a bottom wall 51, a first sidewall 53, and a second sidewall 55, secured to the bottom wall 51. In one embodiment, the bottom wall 51 is substantially perpendicular to the first side wall 53 and the second sidewall 55, and the first sidewall 53 is substantially parallel to the second sidewall 55. The bottom wall 51 defines a water hole 511. The second water inlets 33 are secured to the first sidewall 53. Each drainer tray 50 can support two heat exchangers (not shown). Each second water inlet 33 connects to one of the two heat exchangers.

The water outflow portion 60 comprises a first water outflow pipe 61 and a plurality of second water outflow pipes 63. The plurality of second water outflow pipes 63 is secured to the second sidewall 55. The first water outflow pipe 61 extends out of the chassis 10.

The water tray 70 comprises a body 71 (shown as in FIG. 5) and a plurality of mounting plates 73. The body 71 comprises a bottom board 711, a first side board 712, and two second side boards 713. An acute angel is defined between the bottom board 711 and the first side board 712. The first side board 712 defines a plurality of openings 7121, for connecting to the connecting pipes 90. The plurality of mounting plates 73 is secured to the bottom board 711. Each mounting plate 73 comprises a plate body 731 and two mounting pieces 733 extending from opposite ends of the plate body 731. A first mounting piece 733 defines two mounting holes 7331. An installation piece 735 extends from the opposite mounting piece 733. The installation piece 735 also defines two through holes 7351. In one embodiment, the installation piece 735 is substantially perpendicular to the mounting piece 733.

The plurality of water outlets 80 is secured to the drainer tray 50 and communicates with the water hole 511. The plurality of water outlets 80 extends out of the chassis 10.

Figure 4:
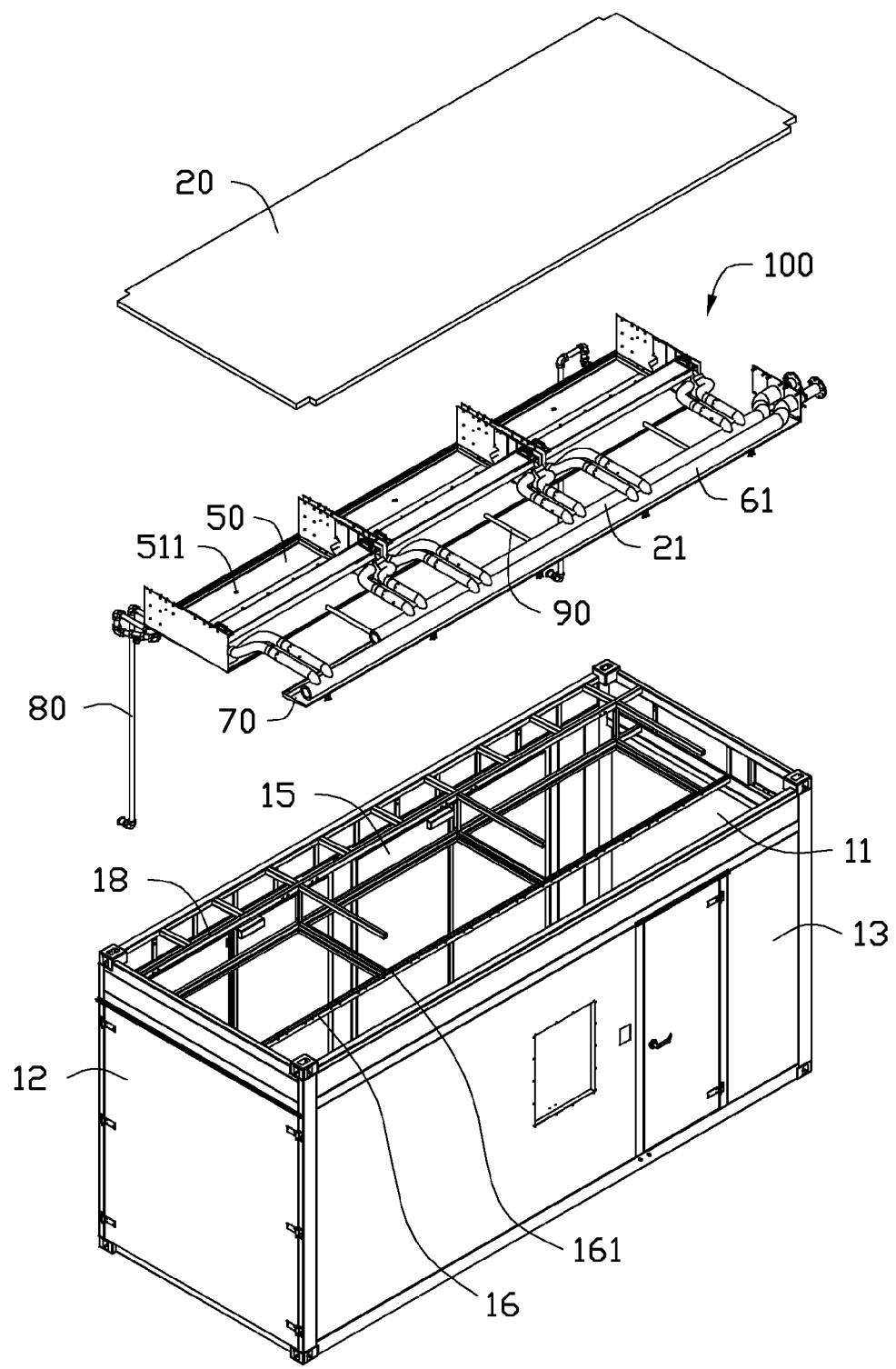
FIG. 4 is an assembled, isometric view of FIG. 3.

Referring to FIG. 4, the connecting pipes 90 are secured to the first side board 712 and communicate with the openings 7121. The connecting pipes 90 communicate with the drainer tray 50 for discharging any water accumulating in the drainer tray 50 to the water tray 70.

Figure 5:
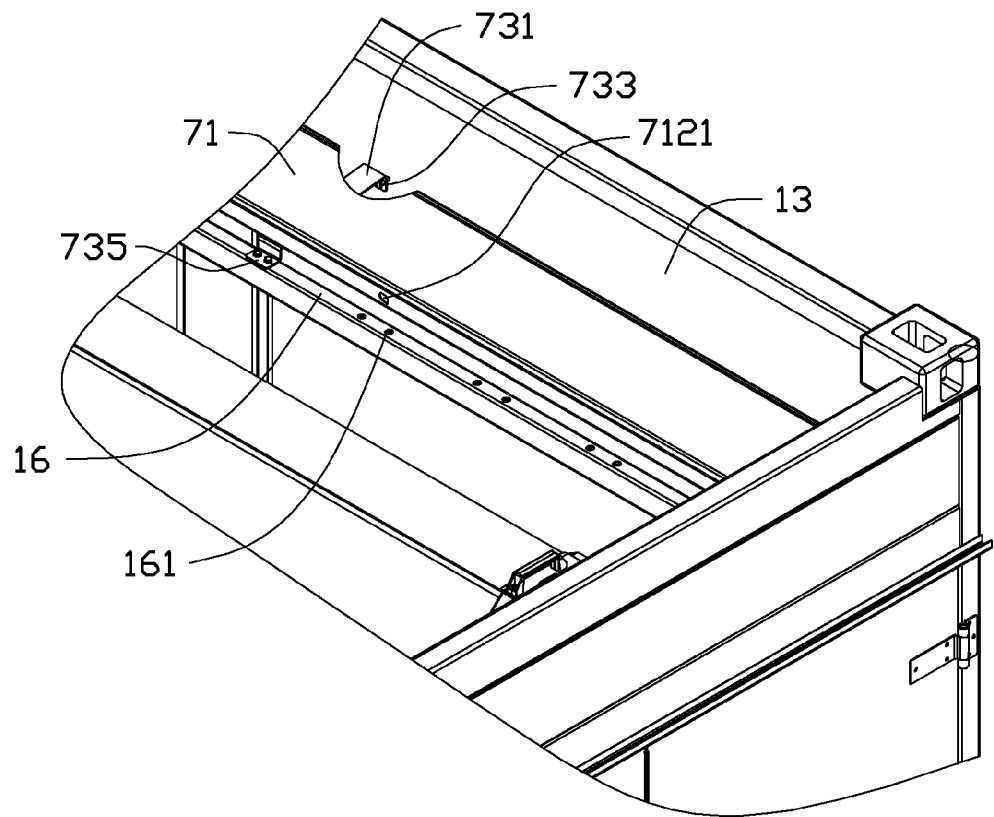
FIG. 5 is an assembled, isometric view of a water tray and a chassis of the data center container of FIG. 1.
Figure 6:
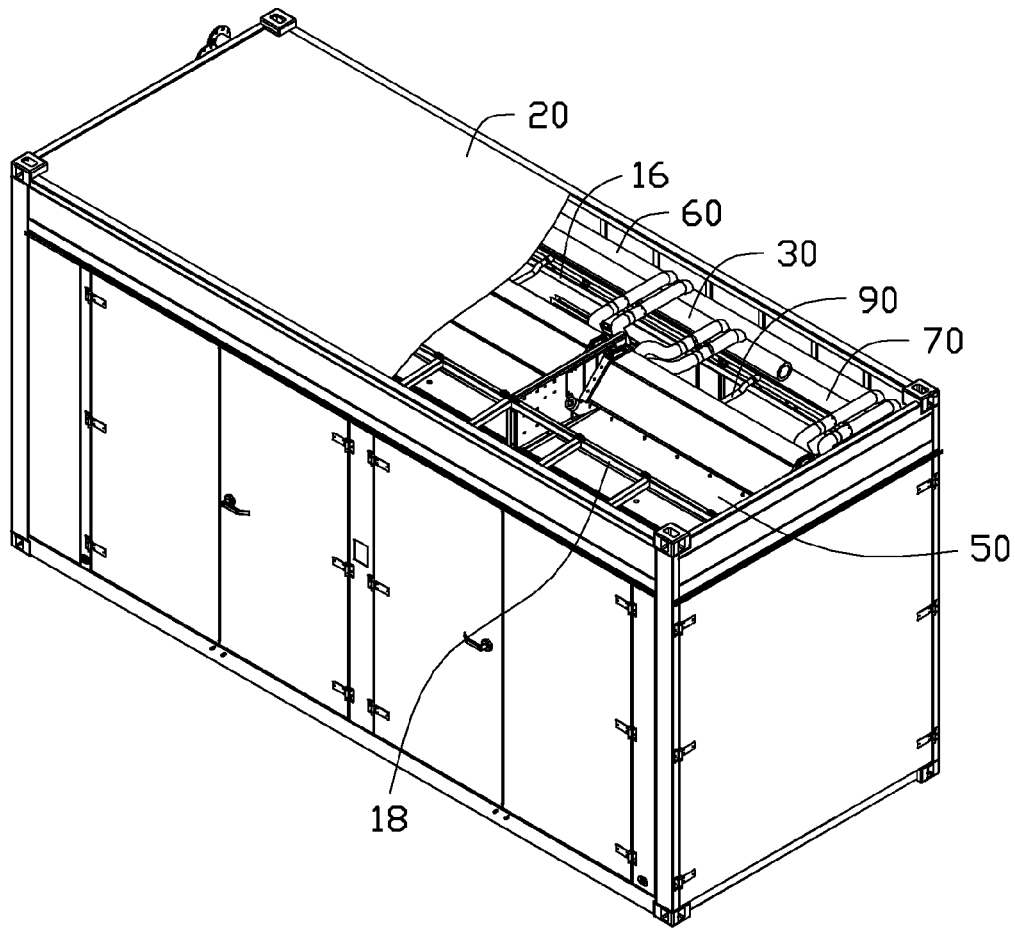
FIG. 6 is an assembled, isometric view of the data center container of FIG. 1, with cutaway cover.

Referring to FIG. 5 and FIG. 6, in assembly, the water inflow portion 30 and the water outflow portion 60 are secured to the cover 20. The drainer tray 50 is secured to the mounting pole 18. The water tray 70 is located under the water inflow portion 30 and the water outflow portion 60. The through hole 7351 is aligned with the installation hole 161. A locking member, such as a screw, is inserted into the through hole 7351 and the installation hole 161. Another screw is inserted into the first side plate 13 through the mounting hole 7331. Thereby, the water tray 70 is mounted in the chassis 10. The water inflow portion 30 and the water outflow portion 60 are located between the cover 20 and the water tray 70.

In use, cold water flows into the cooling system 100 through the first water inlet 31 and into the heat exchanger through the second water inlet 33. Heated water from the heat exchanger flows out of the chassis 10 through the water outflow portion 60. In this process, any condensed water vapor (condensation) formed on outer surfaces of the water inflow portion 30 and the water outflow portion 60 drips in the water tray 70 and then into the drainer tray 50 through the connecting pipe 90. The condensation in the drainer tray 50 flows out of the chassis 10 through the water outlets 80. Thus, condensation will not drip down to affect the appearance of the cooling system 100 or the data center container itself.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. A data center container comprising:
 a chassis;
 a cover secured to the chassis;
 a cooling system located in the chassis comprising a water inflow portion, a water outflow portion, and a drainer tray;
 a water outlet located in the chassis;
 a water tray; and
 a connecting pipe;
 wherein the water outlet communicates with the drainer tray and extends out of the chassis; the drainer tray is secured to the chassis; the water inflow portion and the water outflow portion are located between the cover and the water tray; the connecting pipe connects the water tray with the drainer tray; and the water tray is configured for receiving water dropped from the water inflow portion and the water outflow portion.

2. The data center container of claim 1, wherein the chassis comprises a bottom plate, a front plate, a rear plate, a first side plate, a second side plate, and a support pole located between the front plate and the rear plate; the front plate is substantially parallel to the rear plate; the first side plate is substantially parallel to the second side plate; the bottom plate is substantially perpendicular to the first side plate and the front plate; and the water tray is secured to the support pole and the first side plate.

3. The data center container of claim 2, wherein the water tray comprises a tray body and a mounting plate; the mounting plate comprises a plate body secured to the tray body and two mounting pieces extending from opposite edges of the plate body; and a first of the two mounting pieces is secured to the first side plate, an installation piece extends from a second of the two mounting pieces, and the installation piece is secured to the support pole.

4. The data center container of claim 3, wherein the installation piece is substantially perpendicular to the two mounting pieces.

5. The data center container of claim 3, wherein each of the two mounting pieces is substantially perpendicular to the plate body.

6. The data center container of claim 3, wherein the tray body comprises a bottom board, a first side board, and opposite two second side boards; and the first side board defines an opening, and the connecting pipe communicates with the opening.

7. The data center container of claim 6, wherein an acute angle is defined between the first side board and the bottom board.

8. The data center container of claim 6, wherein the connecting pipe is substantially perpendicular to the first side board.

9. The data center container of claim 1, wherein the drainer tray comprises a bottom wall, a first sidewall and a second sidewall extending from the bottom wall; the first sidewall is substantially parallel to the second sidewall, and the bottom wall is substantially perpendicular to the first sidewall; and the bottom wall defines a water hole, and the water outlet communicates with the water hole.

10. The data center container of claim 9, wherein the water inflow portion is secured to the first sidewall, and the water outflow portion is secured to the second sidewall.

11. A data center container comprising:
 a chassis;
 a cover secured to the chassis;
 a cooling system located in the chassis comprising a water inflow portion, a water outflow portion, and a drainer tray defining a water hole;
 a water outlet located in the chassis;
 a water tray; and
 a connecting pipe;
 wherein the water outlet communicates with the water hole and extends out of the chassis; the drainer tray is secured to the chassis; the water inflow portion and the water outflow portion are located between the cover and the water tray; the connecting pipe communicates with the water tray and the drainer tray; and a water path is defined by the water inflow portion and the water outflow portion, the water tray, the connecting pipe, the drainer tray, and the water outlet.

12. The data center container of claim 11, wherein the chassis comprises a bottom plate, a front plate, a rear plate, a first side plate, a second side plate, and a support pole located between the front plate and the rear plate; the front plate is substantially parallel to the rear plate; the first side plate is substantially parallel to the second side plate; the bottom plate is substantially perpendicular to the first side plate and the front plate; and the water tray is secured to the support pole and the first side plate.

13. The data center container of claim 12, wherein the water tray comprises a tray body and a mounting plate; the mounting plate comprises a plate body secured to the tray body and two mounting pieces extending from opposite edges of the plate body; and a first of the two mounting pieces is secured to the first side plate, an installation piece extends from a second of the two mounting pieces, and the installation piece is secured to the support pole.

14. The data center container of claim 13, wherein the installation piece is substantially perpendicular to the two mounting pieces.

15. The data center container of claim 13, wherein each of the two mounting pieces is substantially perpendicular to the plate body.

16. The data center container of claim 13, wherein the tray body comprises a bottom board, a first side board, and opposite two second side boards; and the first side board defines an opening, and the connecting pipe communicates with the opening.

17. The data center container of claim 16, wherein an acute angle is defined between the first side board and the bottom board.

18. The data center container of claim 16, wherein the connecting pipe is substantially perpendicular to the first side board.

19. The data center container of claim 11, wherein the drainer tray comprises a bottom wall, a first sidewall and a second sidewall extending from the bottom wall; the first sidewall is substantially parallel to the second sidewall, and the bottom wall is substantially perpendicular to the first sidewall; and the water hole is defined in the bottom wall.

20. The data center container of claim 19, wherein the water inflow portion is secured to the first sidewall, and the water outflow portion is secured to the second sidewall.

* * * * *